US012757722B2

(12) United States Patent
Tang

(10) Patent No.: US 12,757,722 B2
(45) Date of Patent: Oct. 6, 2026

(54) MEMORY AND FABRICATION METHOD THEREOF AND MEMORY SYSTEM

(71) Applicant: YANGTZE MEMORY TECHNOLOGIES CO., LTD., Wuhan (CN)

(72) Inventor: Zhaoyun Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 488 days.

(21) Appl. No.: 18/222,876

(22) Filed: Jul. 17, 2023

(65) Prior Publication Data

US 2024/0347452 A1 Oct. 17, 2024

(30) Foreign Application Priority Data

Apr. 13, 2023 (CN) ......................... 202310420141.8

(51) Int. Cl.
*H10B 12/00* (2023.01)
*H10W 20/41* (2026.01)

(52) U.S. Cl.
CPC .......... *H10W 20/435* (2026.01); *H10B 12/02* (2023.02); *H10B 12/315* (2023.02)

(58) Field of Classification Search
CPC .............................. H10B 12/31; H10B 12/315
See application file for complete search history.

(56) References Cited

U.S. PATENT DOCUMENTS

| | | | | |
|---|---|---|---|---|
| 2021/0296319 | A1* | 9/2021 | Sukekawa | G11C 11/4023 |
| 2022/0223732 | A1* | 7/2022 | Ryu | H10B 12/05 |
| 2022/0310637 | A1* | 9/2022 | Lowe | H10B 53/20 |
| 2023/0055499 | A1* | 2/2023 | Lee | H10B 12/05 |
| 2023/0301067 | A1* | 9/2023 | Kim | H10B 12/05 |

* cited by examiner

*Primary Examiner* — Benjamin P Sandvik
(74) *Attorney, Agent, or Firm* — BAYES PLLC

(57) ABSTRACT

The present disclosure discloses a memory device, a method for fabricating a memory device, and a memory system. The method includes: forming a plurality of semiconductor bodies spaced apart and forming spacing portions between adjacent semiconductor bodies, where the plurality of semiconductor bodies extend along a first direction; removing part of the plurality of semiconductor bodies to form a plurality of first grooves between adjacent first spacing portions; forming mask portions protruding out from the first grooves within the first grooves, to form second grooves between adjacent mask portions; forming spacer portions within the second grooves and removing the mask portions to form third grooves between adjacent second spacer portions; and forming conductive connection portions connected to the semiconductor bodies along the first direction within the third grooves.

20 Claims, 16 Drawing Sheets

MEMORY AND FABRICATION METHOD THEREOF AND MEMORY SYSTEM

CROSS-REFERENCE TO RELATED APPLICATIONS

The present application claims the benefit of priority to Chinese Patent Application No. 202310420141.8, filed on Apr. 13, 2023, which is hereby incorporated by reference in its entirety.

TECHNICAL FIELD

The present disclosure relates to the technical field of semiconductors, and particularly to a memory (a.k.a. memory device) and a fabrication method thereof and a memory system.

BACKGROUND

A memory array architecture of dynamic random-access memory (DRAM) is an array consisting of memory cells each including one transistor and one capacitor (i.e., 1T1C memory cells). The transistors are connected with word lines at gates, connected with bit lines at drains, and connected with the capacitors at sources.

In dynamic random access memory devices, the sources are connected with the capacitors through storage node contacts (SNCs). However, due to process limitations, the heights of the storage node contacts are limited and cannot be regulated, which makes it difficult to meet more design requirements.

SUMMARY

Implementations of the present disclosure provide a memory device and a fabrication method thereof and a memory system, which can control the heights of conductive connection portions to meet different design requirements.

Implementations of the present disclosure further provide a fabrication method of a memory device, which includes: forming a plurality of semiconductor bodies spaced apart and spacing portions between adjacent semiconductor bodies, where the semiconductor bodies extend along a first direction; removing part of the semiconductor bodies to form a plurality of first grooves between adjacent spacing portions; forming mask portions protruding out from the first grooves within the first grooves, to form second grooves between adjacent mask portions; forming spacer portions within the second grooves and removing the mask portions, to form third grooves between adjacent spacer portions; and forming conductive connection portions connected to the semiconductor bodies along the first direction within the third grooves.

In some implementations of the present disclosure, during forming the plurality of semiconductor bodies spaced apart and the spacing portions between adjacent semiconductor bodies, drains, channels, and sources that are arranged along the first direction are formed in the semiconductor bodies, and gates close to sides of the channels and gate insulation sub-portions between the gates and the channels are formed in part of the spacing portions.

In some implementations of the present disclosure, the operation of removing part of the semiconductor bodies to form the plurality of first grooves between adjacent spacing portions further includes: forming sacrificial sub-portions located on a side of each of the sources far away from the channels and removing the sacrificial sub-portions for the semiconductor bodies; and removing part of the spacing portions adjacent to the sacrificial sub-portions along a second direction to form the first grooves, the second direction being perpendicular to the first direction.

In some implementations of the present disclosure, widths of the first grooves along the second direction are greater than widths of the semiconductor bodies along the second direction.

In some implementations of the present disclosure, the operation of forming the mask portions protruding out from the first grooves within the first grooves to form the second grooves between adjacent mask portions further includes: forming a barrier layer on a side of each of the sources far away from the channels, the barrier layer covering inner walls of the first grooves and top faces of the spacing portions; forming a mask layer that covers the top faces of the spacing portions and fills the plurality of first grooves on a side of the barrier layer far away from the semiconductor bodies and the spacing portions; and removing the mask layer above the top faces of the spacing portions to form the mask portions.

In some implementations of the present disclosure, the operation of forming the mask layer that covers the top faces of the spacing portions and fills the plurality of first grooves on a side of the barrier layer far away from the semiconductor bodies and the spacing portions further includes: forming a first mask layer that covers the top faces of the spacing portions and fills the plurality of first grooves on a side of the barrier layer far away from the semiconductor bodies and the spacing portions, and forming a plurality of fourth grooves corresponding to the plurality of first grooves on a side of the first mask layer far away from the barrier layer; and forming a second mask layer within the fourth grooves.

In some implementations of the present disclosure, the operation of removing the mask layer above the top faces of the spacing portions to form the mask portions further includes removing part of the first mask layer not covered by the second mask layer to form the mask portions.

In some implementations of the present disclosure, the operation of forming the spacer portions within the second grooves and removing the mask portions to form the third grooves between adjacent spacer portions further includes: removing the barrier layer not covered by the spacer portions.

In some implementations of the present disclosure, the operation of forming the spacer portions within the second grooves and removing the mask portions to form the third grooves between adjacent spacer portions further includes: removing part of the spacer portions adjacent to the first grooves.

In some implementations of the present disclosure, during forming the conductive connection portions connected to the semiconductor bodies along the first direction within the third grooves, widths of ends of the conductive connection portions far away from the semiconductor bodies along the second direction are greater than widths of ends of the conductive connection portions close to the semiconductor bodies along the second direction.

In some implementations of the present disclosure, during forming the conductive connection portions connected to the semiconductor bodies along the first direction within the third grooves, ends of the conductive connection portions close to the semiconductor bodies and the spacing portions overlap along the second direction, and ends of the conductive connection portions far away from the semiconductor bodies and the spacer portions overlap along the second direction.

In some implementations of the present disclosure, during forming the conductive connection portions connected to the semiconductor bodies along the first direction within the third grooves, widths of the conductive connection portions along the second direction are greater than widths of the semiconductor bodies along the second direction.

Implementations of the present disclosure further provide a memory device, including: a plurality of semiconductor bodies spaced apart and spacing portions disposed between adjacent semiconductor bodies, where the semiconductor bodies extend along a first direction; conductive connection portions connected to the semiconductor bodies along the first direction; and spacer portions disposed on sides of the spacing portions along the first direction and disposed around the conductive connection portions, where the conductive connection portions and the spacing portions overlap along a second direction that is perpendicular to the first direction.

In some implementations of the present disclosure, the semiconductor bodies include drains, channels, and sources that are arranged along the first direction, and the sources are located on sides of the channels close to the conductive connection portions that are connected to the sources along the first direction.

In some implementations of the present disclosure, part of the spacing portions include gates close to sides of the channels and gate insulation sub-portions between the gates and the channels.

In some implementations of the present disclosure, ends of the conductive connection portions close to the semiconductor bodies and the spacing portions overlap along the second direction, and ends of the conductive connection portions far away from the semiconductor bodies and the spacer portions overlap along the second direction.

In some implementations of the present disclosure, widths of ends of the conductive connection portions far away from the semiconductor bodies along the second direction are greater than widths of ends of the conductive connection portions close to the semiconductor bodies along the second direction.

In some implementations of the present disclosure, widths of the conductive connection portions along the second direction are greater than widths of the semiconductor bodies along the second direction.

In some implementations of the present disclosure, the memory device further includes a barrier layer disposed between the spacer portions and the spacing portions.

Implementations of the present disclosure further provide a memory system including the memory device and a controller coupled to the memory device and configured to control the memory device to store data.

In the fabrication method of the memory device of the present disclosure, the mask portions are formed to reserve and control the heights of the conductive connection portions to be formed. Then, when the mask portions are removed to form the third grooves, the conductive connection portions may be formed within the third grooves. In other words, the heights of the conductive connection portions can be controlled by the depths of the third grooves, and may be further controlled by the heights of the mask portions, such that the memory device provided by implementations of the present disclosure can achieve controllable heights of the conductive connection portions to meet different design requirements, thereby improving the applicability of the memory device.

BRIEF DESCRIPTION OF DRAWINGS

The technical solution and other advantageous effects of the present disclosure will be apparent through the detailed description of implementations of the present disclosure below in conjunction with the drawings.

DETAILED DESCRIPTION

Figure 1:
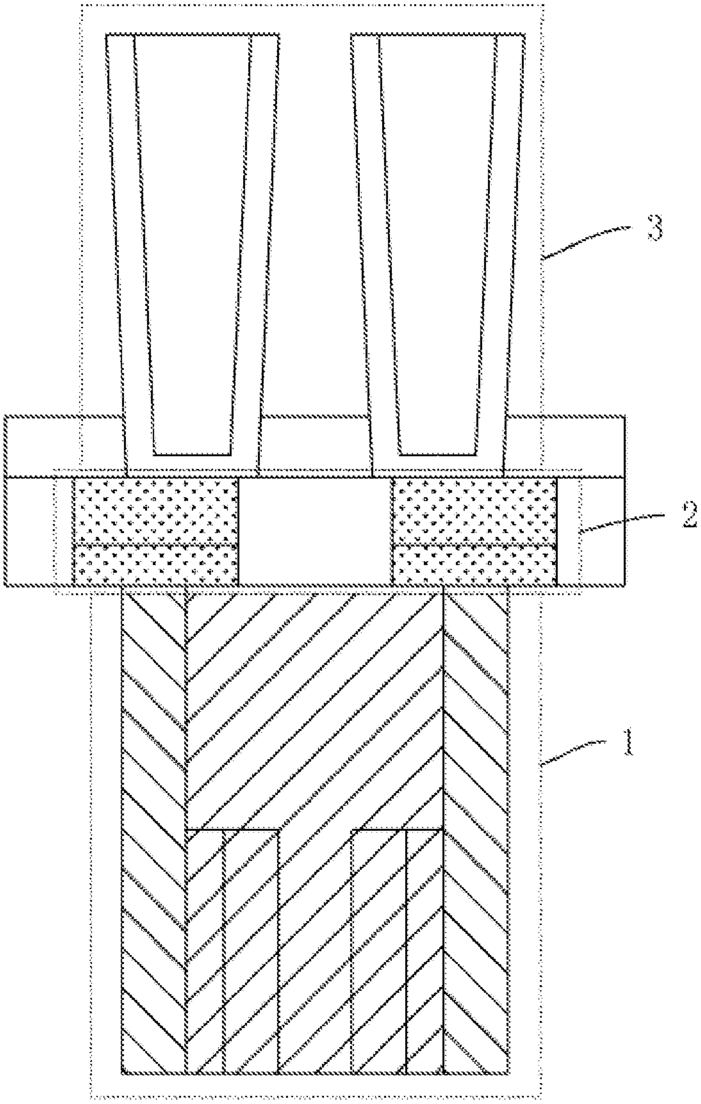
FIG. 1 is a schematic structure diagram of a memory device in some implementations.

The technical solutions in implementations of the present disclosure will be described below in conjunction with the drawings of the present disclosure. The implementations described are only part of, but not all, the implementations of the present disclosure. All other implementations obtained by those skilled in the art based on the implementations in the present disclosure without creative work shall fall in the scope of protection of the present disclosure.

The disclosure below provides different implementations or examples to achieve different structures of the present disclosure. In order to simplify the present disclosure, components and settings of specific examples are described below. They are merely exemplary implementations, and are not intended to limit the present disclosure. In addition, the present disclosure may repeat the reference numerals and/or reference letters in different examples, and such repetitions are for the purposes of simplification and clarity, and do not indicate on themselves the relationships between various implementations and/or settings as discussed. In addition, the present disclosure provides examples of various processes and materials. However, those of ordinary skill in the art may realize the application of other processes and/or use of other materials.

Figure 2:
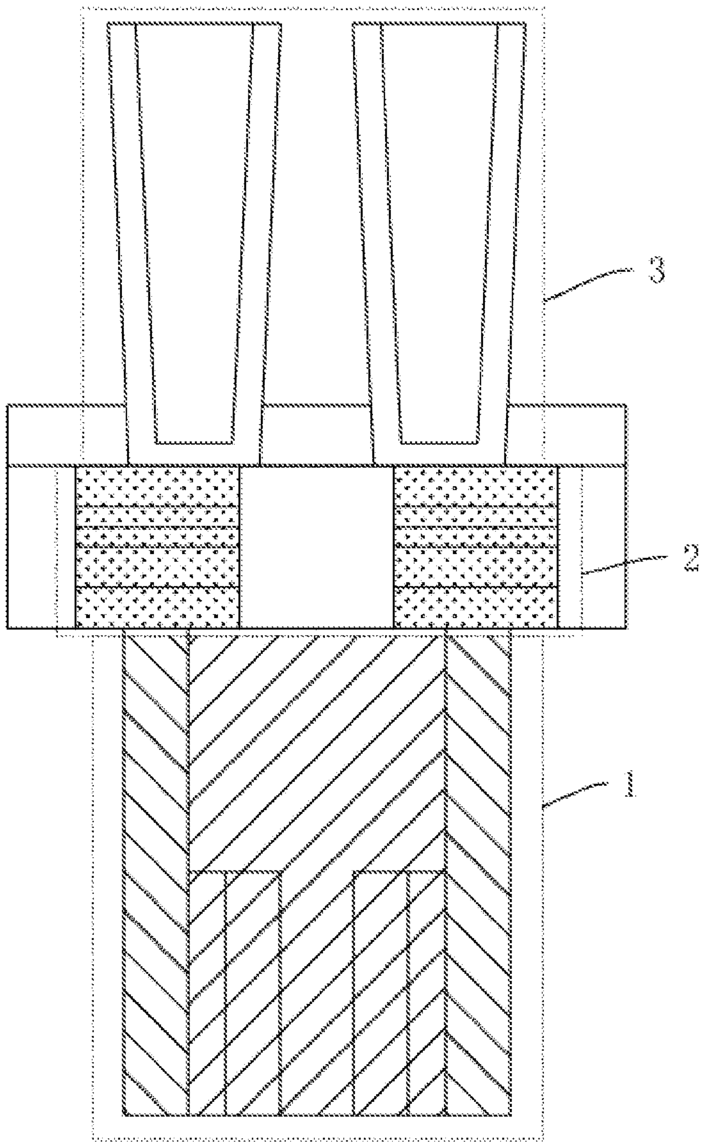
FIG. 2 is another schematic structure diagram of a memory device in some implementations.
Figure 3:
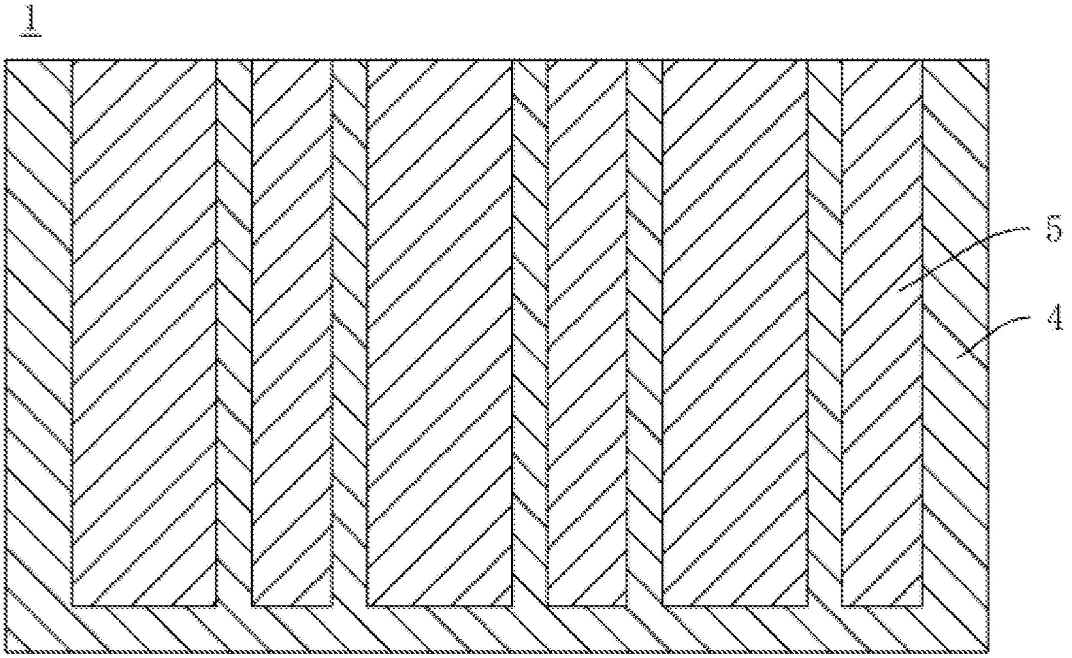
FIGS. 3 to 7 are schematic structure diagrams of a fabrication process of a memory device in some implementations.
Figure 4:
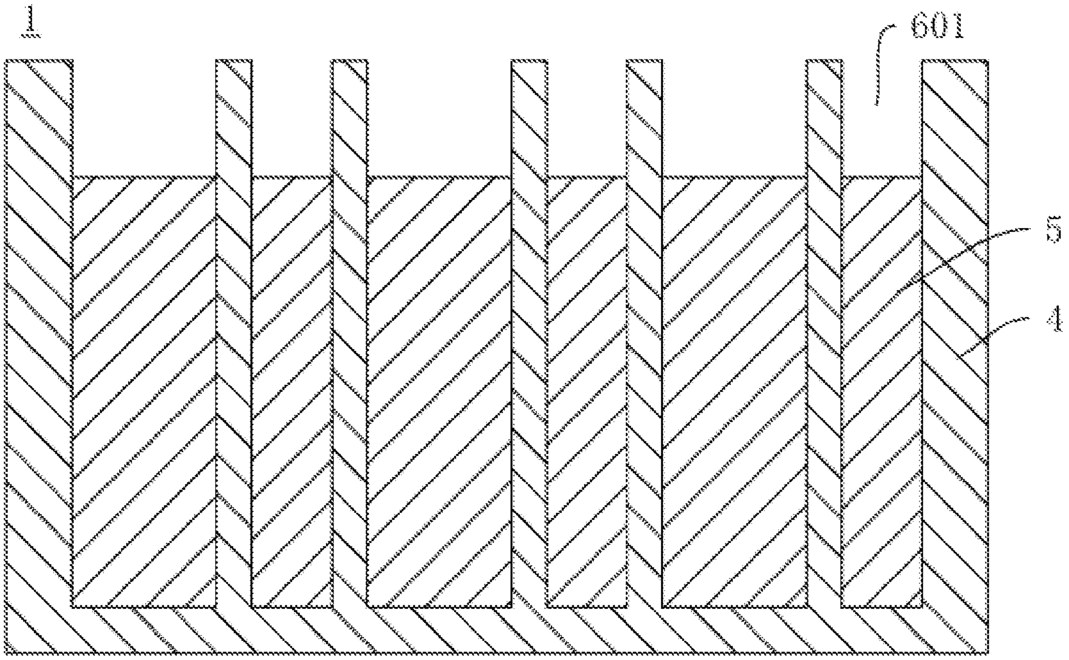
Figure 5:
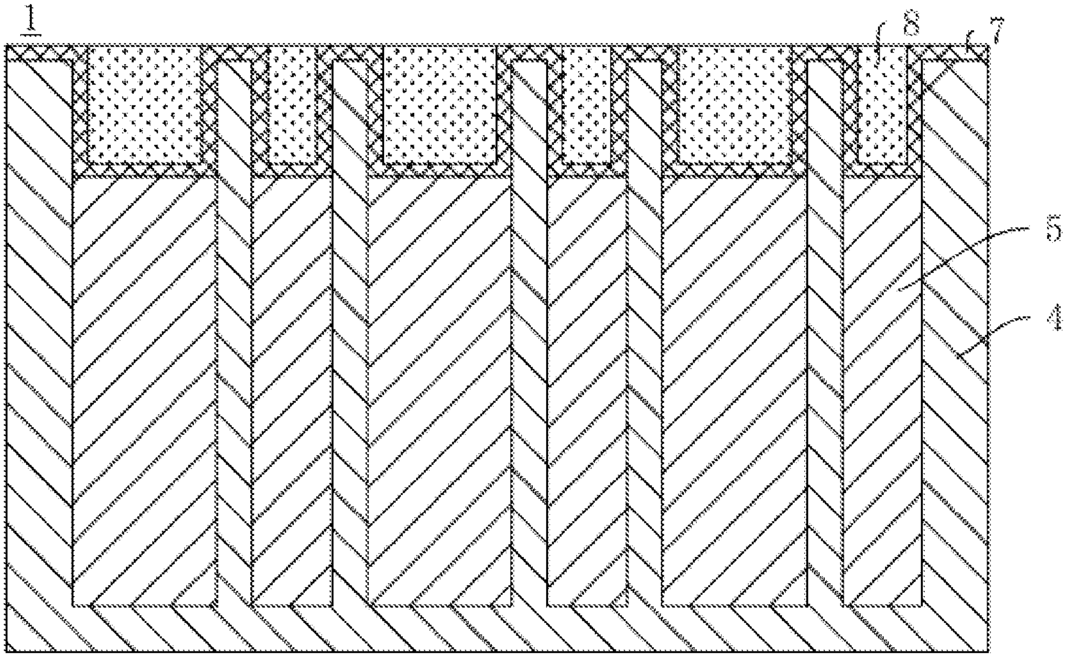
Figure 6:
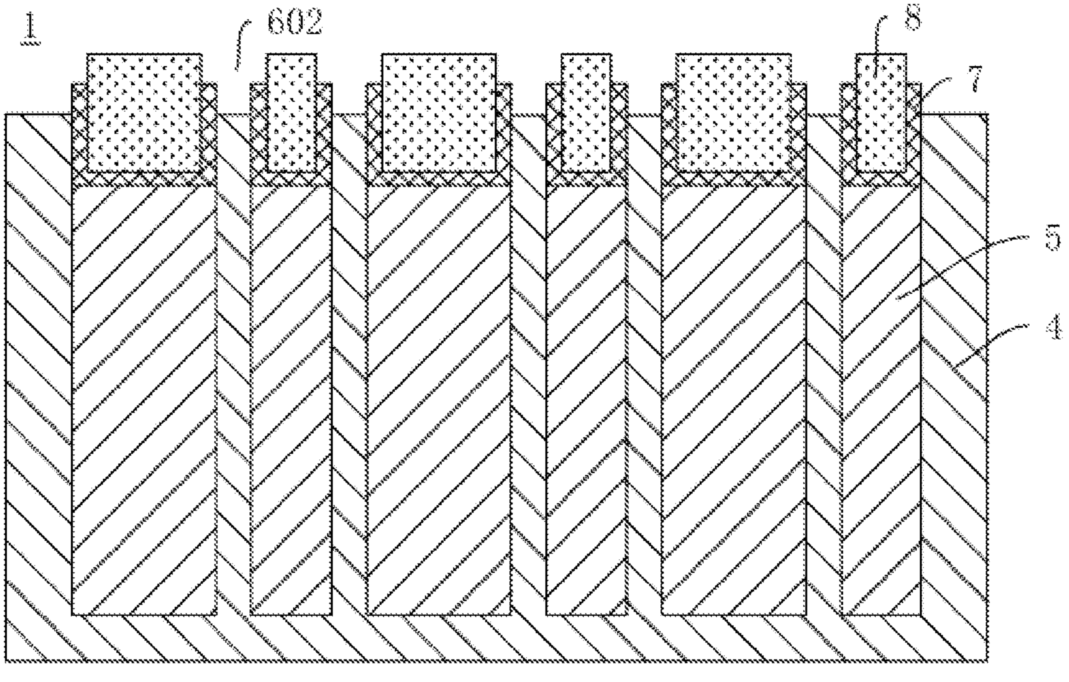
Figure 7:
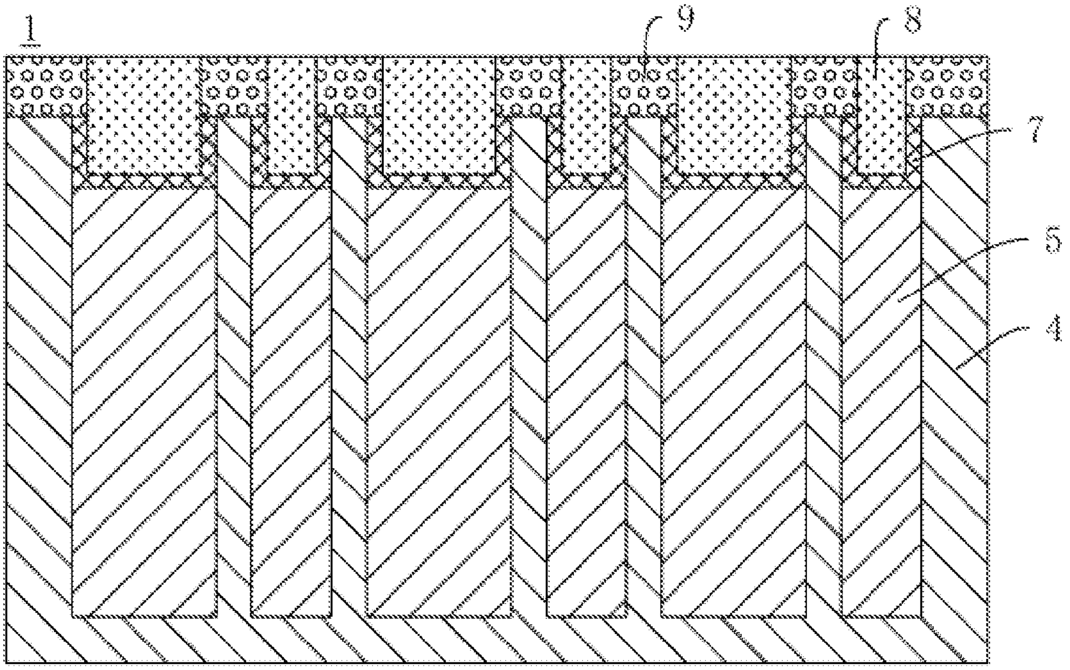

Referring to FIGS. 1 and 2, a dynamic random access memory device includes a transistor cell 1, a capacitor cell 3, and a storage node contact 2 connected between the transistor cell 1 and the capacitor cell 3. The storage node contact 2 may be fabricated by means of a self-aligned contact (as shown in FIG. 1) or by means of double-patterning (as shown in FIG. 2). A process of fabricating the storage node contact 2 by means of the self-aligned contact includes: 1), referring to FIGS. 1 and 3 to 7, a base is provided, and a plurality of channel devices 4 with spaced arrangements are formed in the base, along with insulation portions 5 located between adjacent channel devices 4, as shown in FIG. 3; 2), the insulation portions 5 between adjacent channel devices 4 are etched, and part of the insulation portions 5 are removed to form first grooves 601 between adjacent channel devices 4, as shown in FIG. 4; 3) a barrier layer 7 and a mask layer 8 are formed on the base sequentially; the barrier layer 7 continuously covers a plurality of the channel devices 4 and inner walls of the first grooves 601, and the mask layer 8 is filled within the first grooves 601, as shown in FIG. 5; 4) the channel devices 4 are etched to form second grooves 602 between adjacent mask layers 8, as shown in FIG. 6; and 5) part of the barrier layer 7 within the second grooves 602 may be removed, and then the storage node contacts 9 are deposited within the second grooves 602, as shown in FIG. 7.

Figure 8:
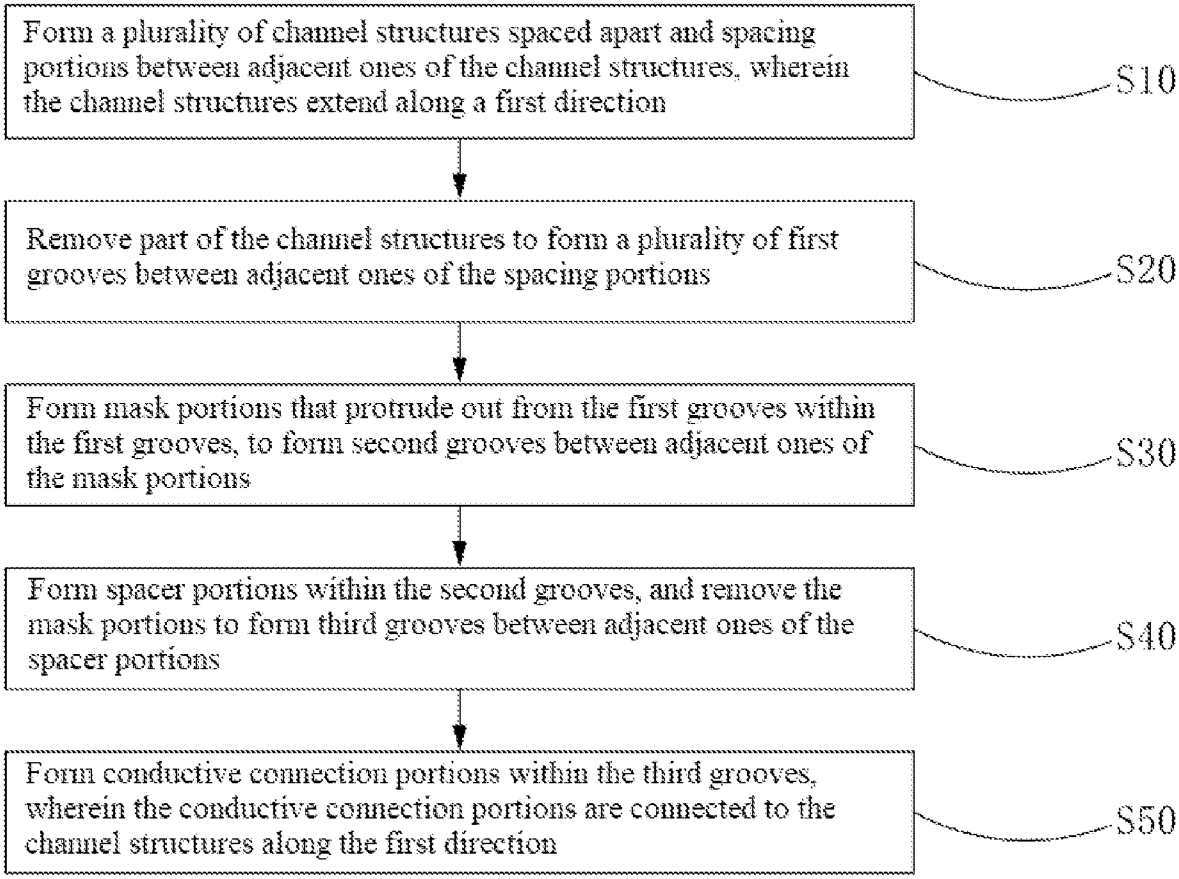
FIG. 8 is a flow diagram of a fabrication method of a memory device provided by some implementations of the present disclosure.

From above, referring to FIG. 8, some implementations of the present disclosure provide a fabrication method of a memory device, including: forming a plurality of semiconductor bodies spaced apart and spacing portions between adjacent semiconductor bodies, where the semiconductor bodies extend along a first direction; removing part of the semiconductor bodies to form a plurality of first grooves between adjacent spacing portions; forming mask portions protruding out from the first grooves within the first grooves, to form second grooves between adjacent mask portions; forming spacer portions within the second grooves and removing the mask portions, to form third grooves between adjacent spacer portions; and forming conductive connection portions connected to the semiconductor bodies along the first direction within the third grooves.

In the fabrication method of the memory device of the present disclosure, the mask portions are formed to reserve and control the heights of the conductive connection portions to be formed. Then, when the mask portions are removed to form the third grooves, the conductive connection portions may be formed within the third grooves. In other words, the heights of the conductive connection portions can be controlled by the depths of the third grooves, and may be further controlled by the heights of the mask portions, such that the memory device provided by implementations of the present disclosure can achieve the controllable heights of the conductive connection portions to meet different design requirements, thereby improving the applicability of the memory device.

In conjunction with FIGS. 8 through 20, the fabrication method of the memory device includes the following operations.

At operation S10, a plurality of semiconductor bodies 10 and spacing portions 20 can be formed. The semiconductor bodies 10 can space apart. The spacing portions 20 can be located between adjacent semiconductor bodies 10. The semiconductor bodies 10 can extend along a first direction X.

Figure 9:
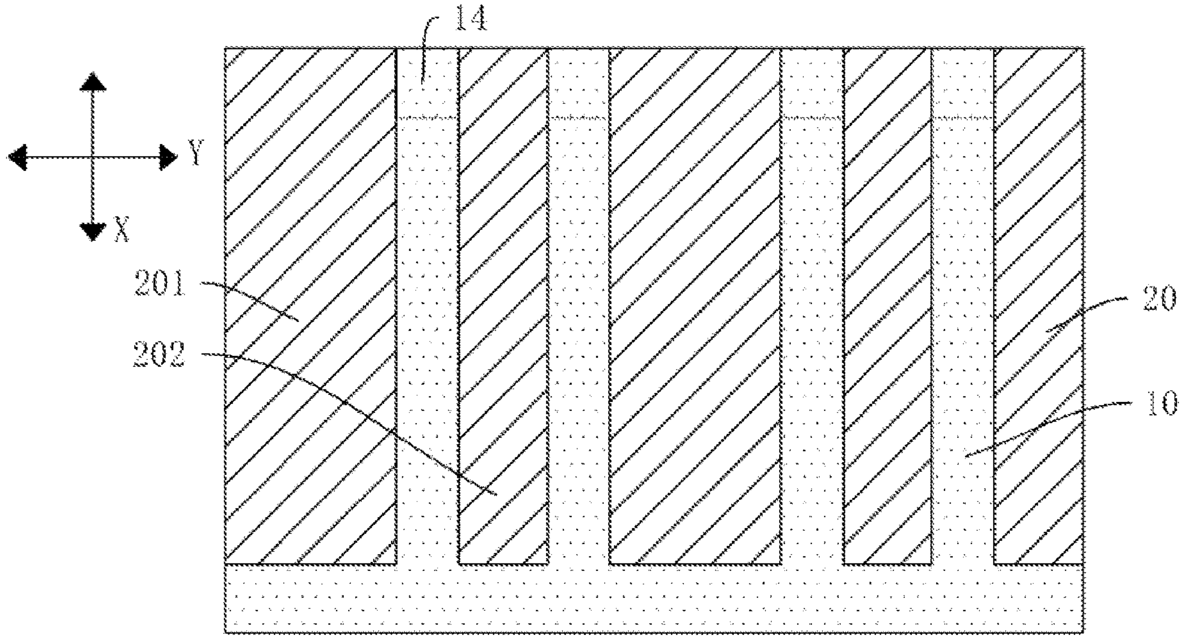
FIGS. 9 to 19 are schematic structure diagrams of a fabrication process of a memory device provided by some implementations of the present disclosure.

At operation S10, referring to FIG. 9, first, a base structure is provided, and a plurality of semiconductor bodies 10 and spacing portions 20 between adjacent semiconductor bodies 10 are formed in the base structure.

Figure 21:
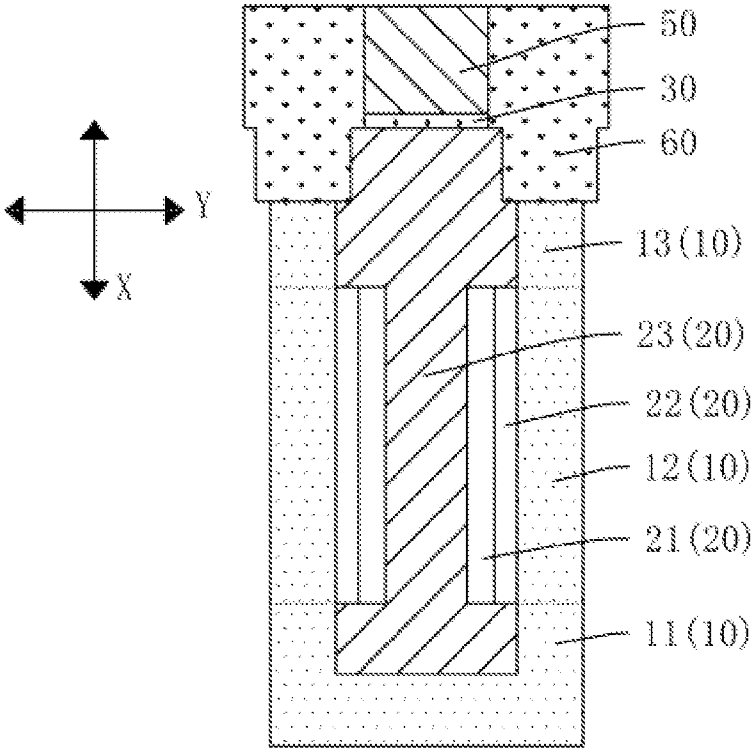
FIG. 21 is a partial schematic structure diagram of a device of a memory device provided by some implementations of the present disclosure.

The semiconductor bodies 10 extend along the first direction (X direction), and may include drains 11, channels 12, and sources 13 arranged along the first direction (X direction) as shown in FIG. 21. In some implementations, the semiconductor bodies 10 may further include sacrificial sub-portions 14 (as shown in FIG. 9) disposed on sides of the sources 13 far away from the channels 12, to facilitate etching processing in a subsequent fabrication process.

Gates 21 close to sides of the channel 12 and gate insulation sub-portions 22 between the gates 21 and the channels 12 are formed in part of the spacing portions 20. In some implementations, the spacing portions 20 further include dielectric sub-portions 23 cladding the gates 21 and the gate insulation sub-portions 22.

In some implementations, the spacing portions 20 include a plurality of first spacing portions 201 and a plurality of second spacing portions 202 which are alternately disposed. The gates 21, the gate insulation sub-portions 22, and the dielectric sub-portions 23 cladding the gates 21 and the gate insulation sub-portions 22 may be formed in the first spacing portions 201, while only the dielectric sub-portions 23 are formed in the second spacing portions 202.

In some implementations, the material of the semiconductor bodies 10 may include a monocrystalline silicon material, or other semiconductor materials, or a combination of a semiconductor material and a conductive material. The material of gate 21 may be a conductive material; and the material of the gate insulation sub-portions 22 and the dielectric sub-portions 23 may be an insulating material, e.g., silicon nitride or silicon oxide, etc.

The top faces of the semiconductor bodies 10 and the spacing portions 20 may be processed with a chemical mechanical polishing process to obtain a flush top face.

S20, removing part of the semiconductor bodies 10 to form a plurality of first grooves 101 between adjacent spacing portions 20.

Figure 10:
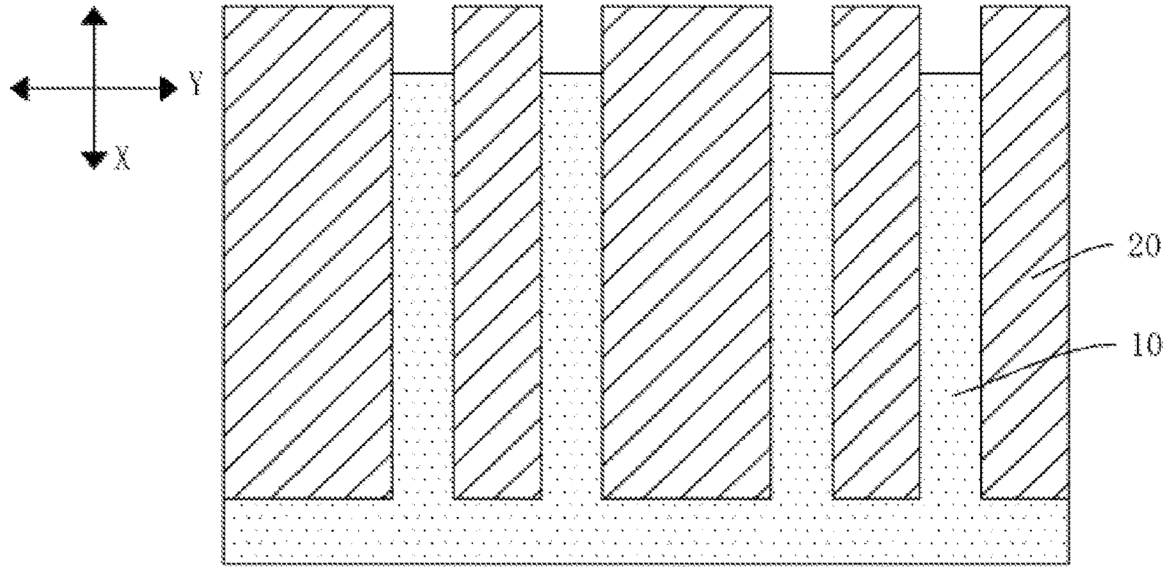
Figure 11:
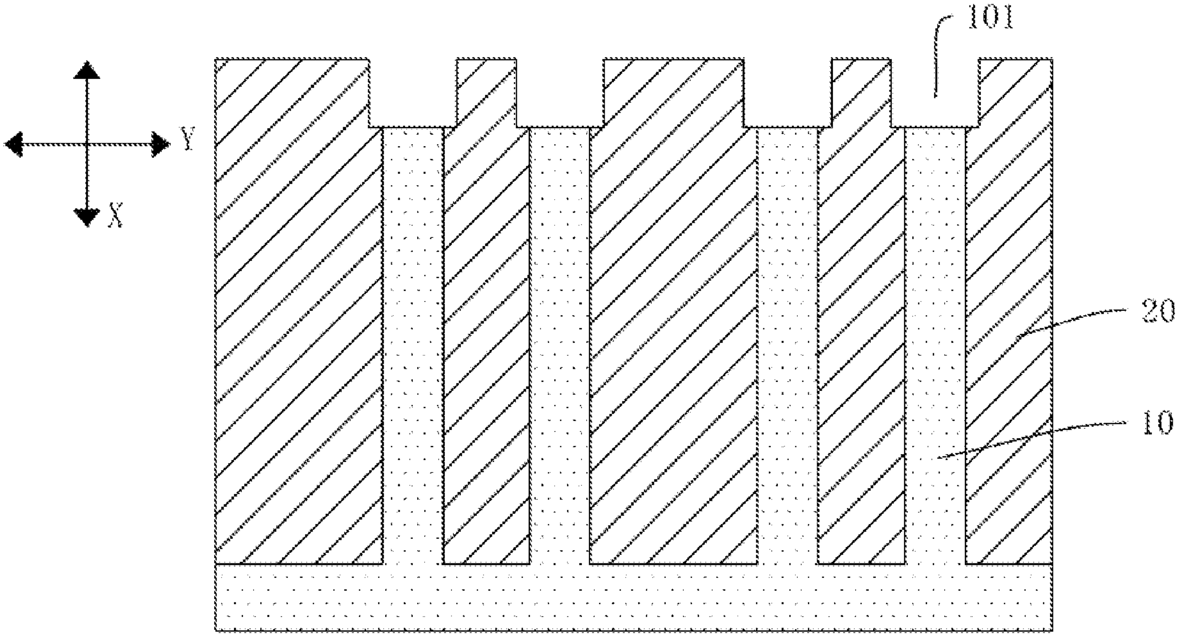

At operation S20, referring to FIGS. 10 and 11, sides of the semiconductor bodies 10 close to the top face are etched along the first direction (X direction) to remove the sacrificial sub-portions 14 formed in operation S10, as shown in FIG. 10.

At the same time, part of the spacing portions 20 adjacent to the sacrificial sub-portions 14 along a second direction (Y direction) are removed to form the first grooves 101, as shown in FIG. 11. The second direction (Y direction) is perpendicular to the first direction (X direction), and the bottom faces of the first grooves 101 expose the sources 13; while in the semiconductor bodies 10, the channels 12 are located on sides of the sources 13 far away from the first grooves 101, and the drains 11 are located on sides of the channels 12 far away from the sources 13.

In some implementations of the present disclosure, by etching the spacing portions 20 adjacent to the sacrificial sub-portions 14, the widths of the first grooves 101 along the second direction may be effectively expanded, i.e., the widths of the first grooves 101 along the second direction are greater than the widths of the semiconductor bodies 10 along the second direction.

At S30, mask portions 43 are formed, which protrude out from the first grooves 101 within the first grooves 101, to form second grooves 102 between adjacent mask portions 43.

Figure 12:
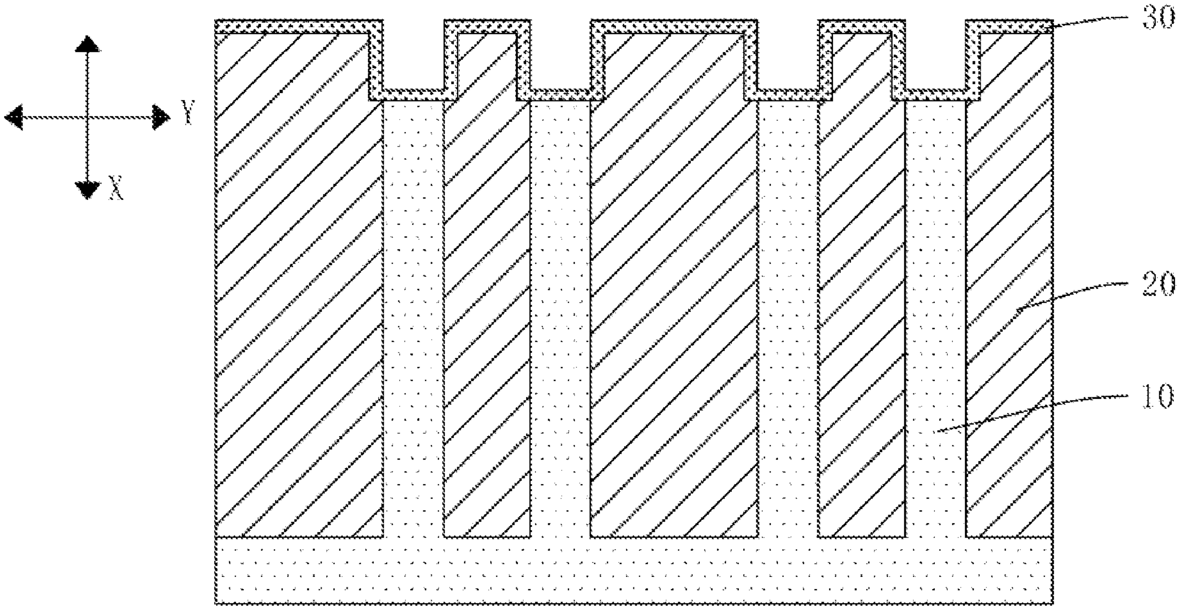

At operation S30, in conjunction with FIGS. 12-15, a barrier layer 30 is deposited on the base structure, and covers the top faces of the spacing portions 20 and inner walls of the first grooves 101, as shown in FIG. 12. Then, a mask layer 40 is formed on a side of the barrier layer 30 far away from the semiconductor bodies 10 and the spacing portions 20, and covers the top faces of the spacing portions 20 and fills the plurality of first grooves 101. Subsequently, the mask layer 40 above the top faces of the spacing portions 20 is removed to form mask portions 43.

In some implementations, the material of the barrier layer 30 may include a silicon nitride material.

Figure 13:
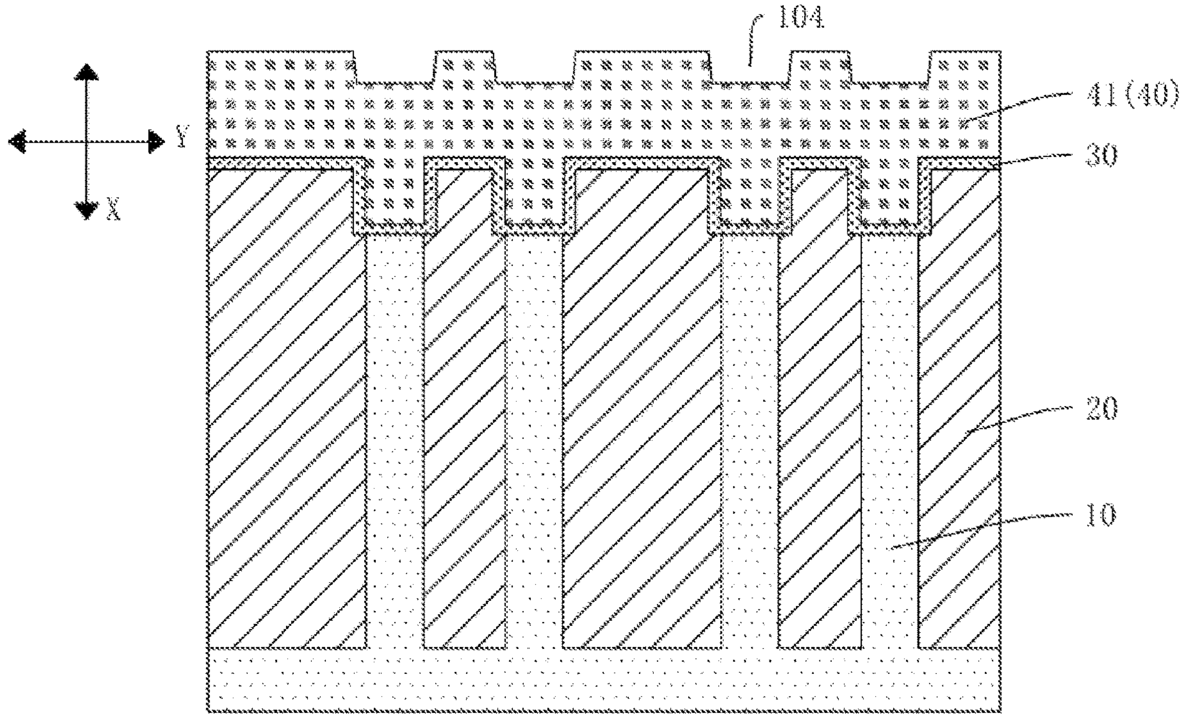
Figure 14:
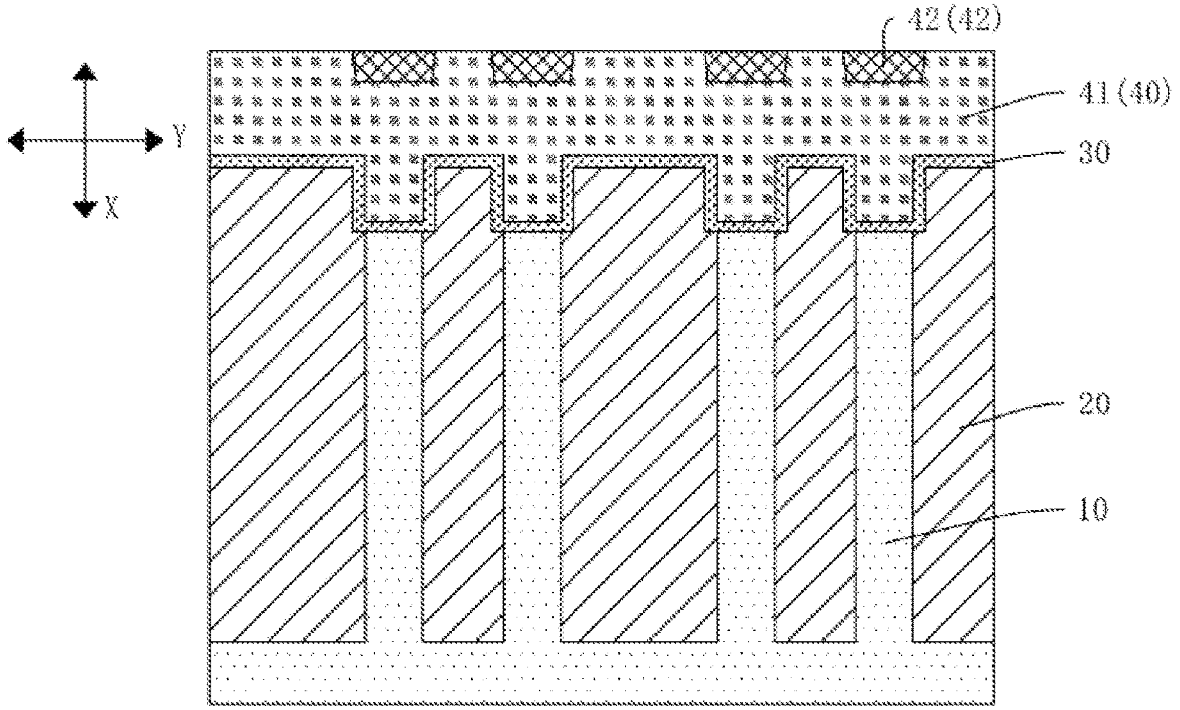
Figure 15:
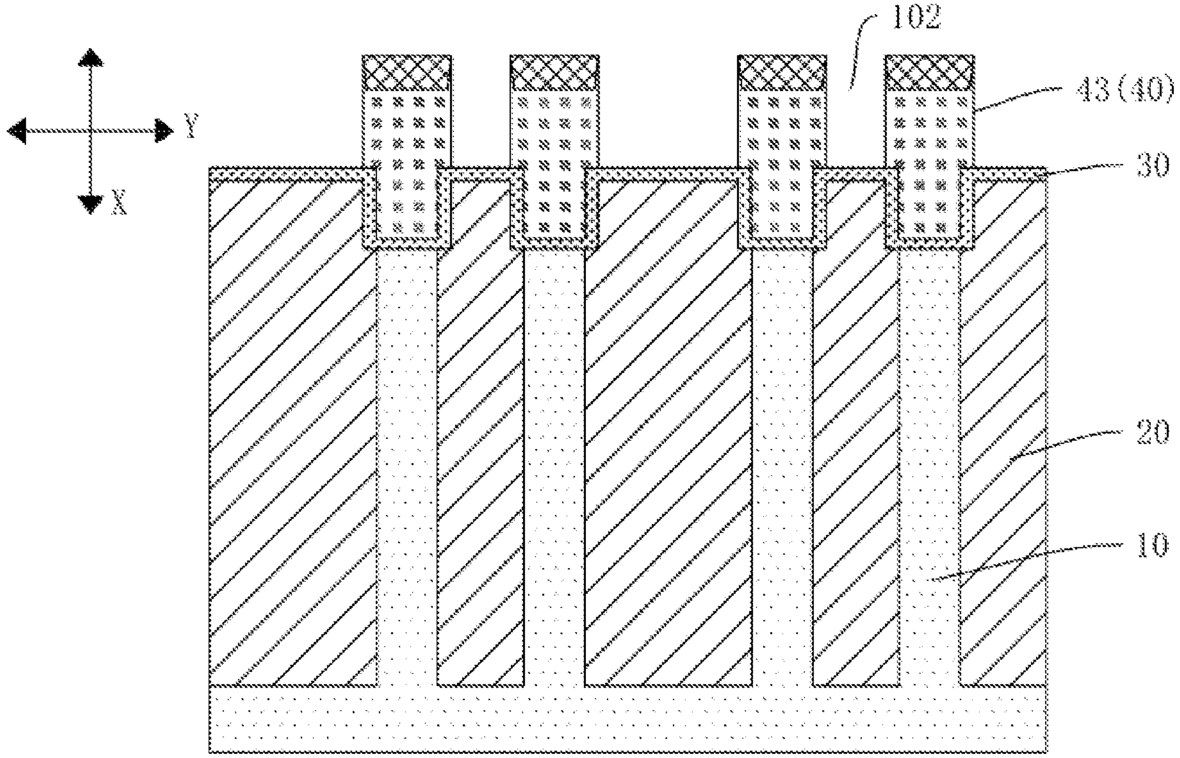

A formation process of the mask portions 43 includes: forming, on a side of the barrier layer 30 far away from the semiconductor bodies 10 and the spacing portions 20, a first mask layer 41 that covers the top faces of the spacing portions 20 and fills the plurality of first grooves 101, and forming a plurality of fourth grooves 104 corresponding to the plurality of first grooves 101 on a side of the first mask layer 41 far away from the barrier layer 30, as shown in FIG. 13; forming a second mask material layer on the first mask layer 41, and performing chemical mechanical polishing processing on the second mask material layer to remove the second mask material layer beyond the fourth grooves 104, so a second mask layer 42 may be formed within the fourth grooves 104, and the top face of the second mask layer 42 may be flush with the top face of the first mask layer 41, as shown in FIG. 14; and removing the first mask layer 41 not covered by the second mask layer 42 to form the mask portions 43, as shown in FIG. 15. It may be understood that, the mask portions 43 are formed by stacking the second mask layer 42 and the unremoved first mask layer 41.

The material of the first mask layer 41 may include a silicon oxide material, while the material of the second mask layer 42 may include an amorphous carbon material. After part of the first mask layer 41 not covered by the second mask layer 42 is removed, the mask portions 43 are filled within the first grooves 101, and protrude out from the first grooves 101. Then, the second grooves 102 are formed between adjacent mask portions 43, and the bottom faces of the second grooves 102 expose the barrier layer 30 located on the top faces of the spacing portions 20.

At S40, spacer portions 50 are formed within the second grooves 102 and the mask portions 43 are removed to form third grooves 103 between adjacent spacer portions 50.

Figure 16:
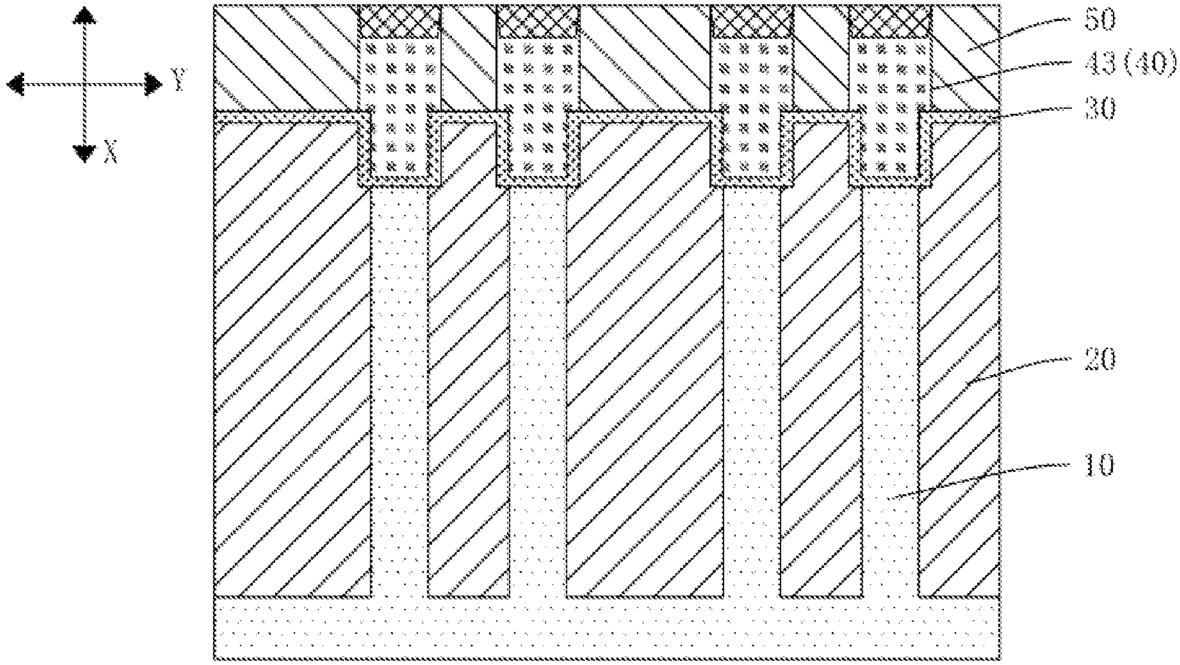
Figure 17:
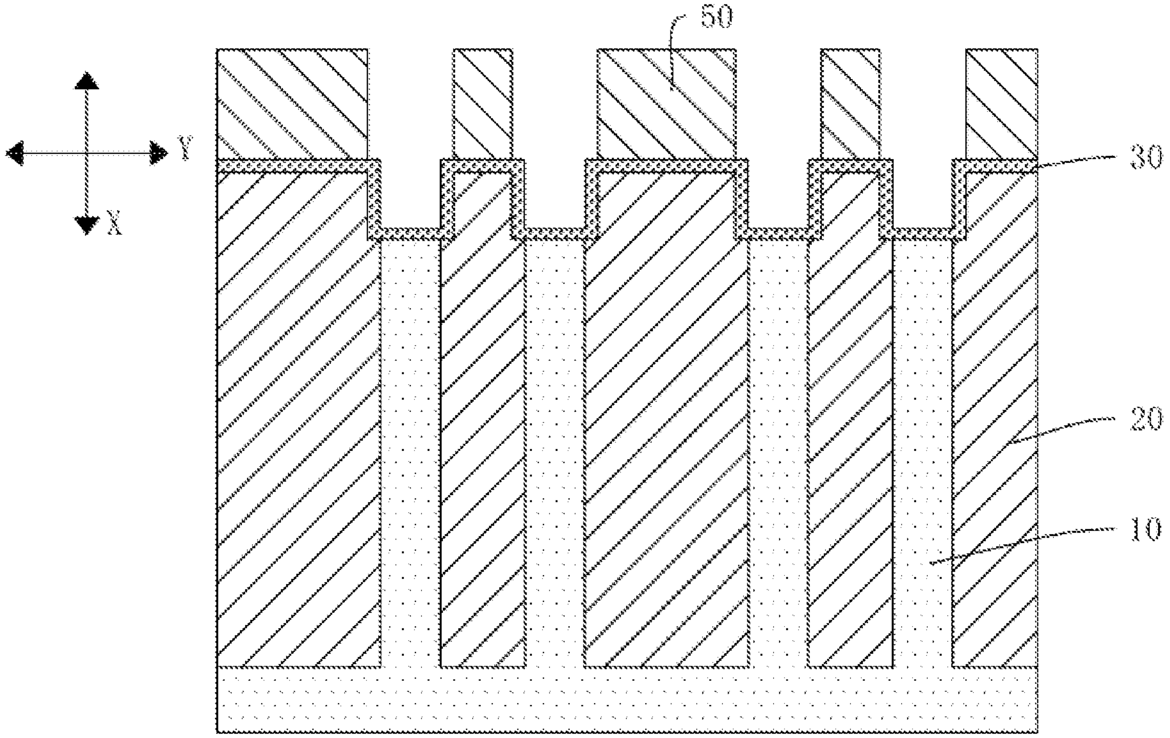
Figure 18:
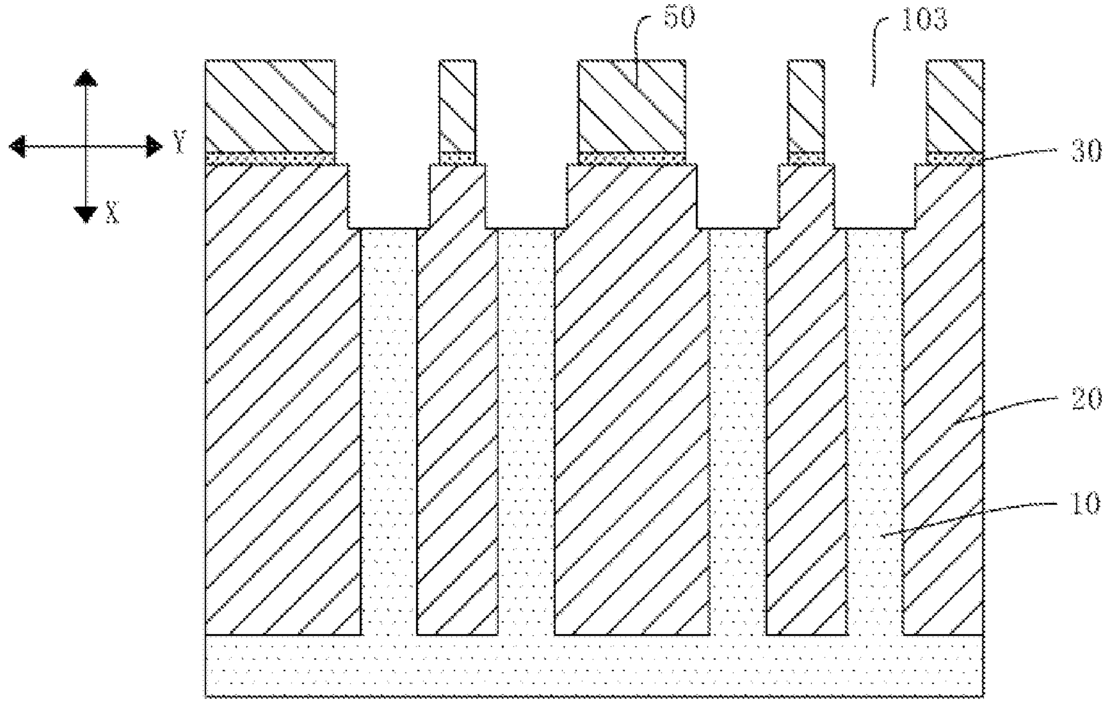

At operation S40, in conjunction with FIGS. 16-18, first, a spacer material layer is formed on the base structure, and is at least filled within the second grooves 102; then, the spacer material layer is ground by using a chemical mechanical polishing process to remove the spacer material layer beyond the second grooves 102 and form the spacer portions 50 within the second grooves 102, as shown in FIG. 16.

Subsequently, the mask portions 43 are removed, as shown in FIG. 17.

In a process of removing the mask portions 43, there is also a need to remove the barrier layer 30 not covered by the spacer portions 50 and remove part of the spacer portions 50 adjacent to the first grooves 101, to obtain the third grooves 103, as shown in FIG. 18. That is, by removing the barrier layer 30, the semiconductor bodies 10 at the bottom faces of the third grooves 103 may be exposed, and the widths of the third grooves 103 along the second direction (Y direction) on the sides close to the semiconductor bodies 10 are expanded. In addition, by removing part of the spacer portions 50 adjacent to the first grooves 101, the widths of the third grooves 103 along the second direction on the sides far away from semiconductor bodies 10 may be expanded, such that the third grooves 103 expose the sources 13 of the underlying semiconductor bodies 10, and the widths of the third grooves 103 along the second direction are expanded overall, so as to increase the widths of subsequently formed conductive connection portions 60 along the second direction, thereby reducing resistance and improving signal transmission effectiveness.

At S50, conductive connection portions 60 are formed within the third grooves 103, where the conductive connection portions 60 are connected to the semiconductor bodies 10 along the first direction.

Figure 19:
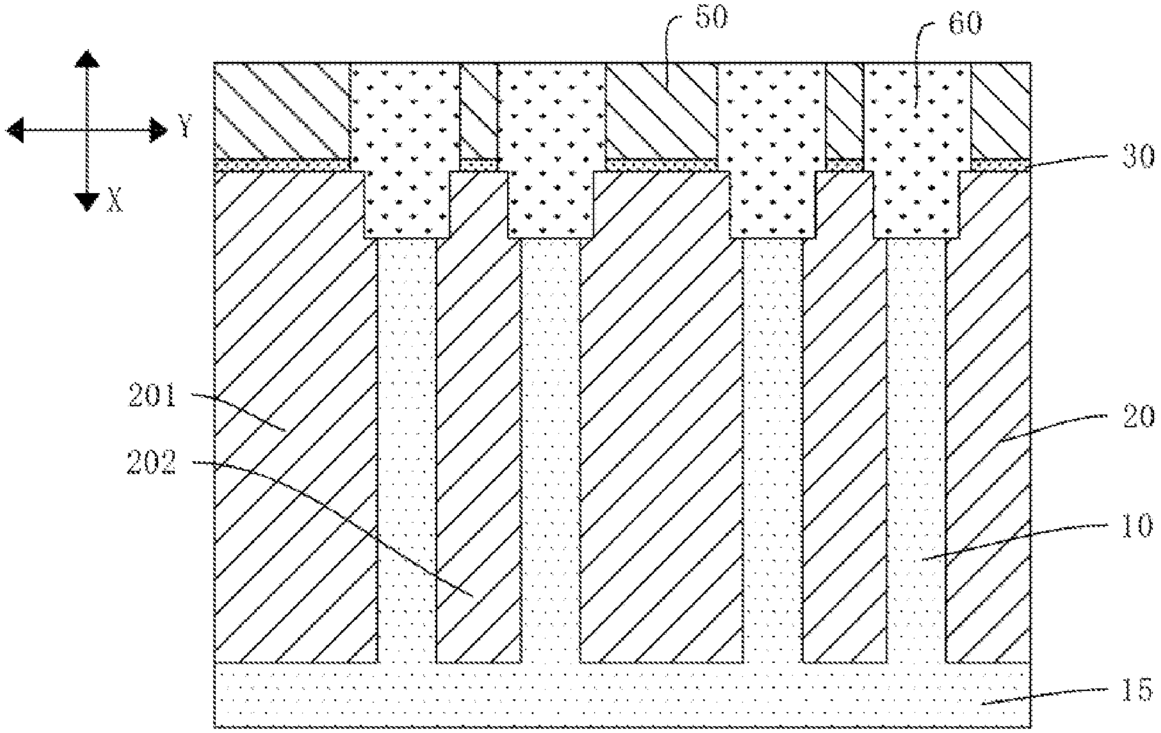

At operation S50, referring to FIG. 19, a conductive material layer may be formed on the spacer portions 50 and the base structure. Chemical mechanical polishing processing may be performed on the conductive material layer to remove the conductive material layer beyond the third grooves 103. Then, the conductive connection portions 60 within the third grooves 103 may be formed, and the top faces of the conductive connection portions 60 are flush with the top faces of the spacer portions 50. The material of the conductive connection portions 60 may be a polysilicon material or other conductive materials.

In some implementations of the present disclosure, the mask portions 43 are formed through the mask layer 40, and the conductive connection portions 60 are deposited in the third grooves 103 obtained by removing the mask portions 43. Then, the heights of the conductive connection portions 60 may be precisely controlled by controlling the heights of the mask portions 43, such that the heights of the conductive connection portions 60 are controllable, improving the applicability and development of the memory device.

In some implementations of the present disclosure, the conductive connection portions 60 are filled within the third grooves 103, and the widths of ends of the conductive connection portions 60 far away from the semiconductor bodies 10 along the second direction are greater than the widths of ends of the conductive connection portions 60 close to the semiconductor bodies 10 along the second direction. The ends of the conductive connection portions 60 close to the semiconductor bodies 10 and the spacing portions 20 overlap along the second direction, and the ends of the conductive connection portions 60 far away from the semiconductor bodies 10 and the spacer portions 50 overlap along the second direction. The widths of the conductive connection portions 60 along the second direction are greater than the widths of the semiconductor bodies 10 along the second direction. In some implementations, the widths of the conductive connection portions 60 along the second direction on the sides close to the semiconductor bodies 10 are greater than the maximum width of the semiconductor bodies 10 along the second direction.

In operation S20, the widths of the first grooves 101 along the second direction Y are expanded by etching the spacing portions 20 adjacent to the sacrificial sub-portions 14. Then, in operation S40, the widths of the third grooves 103 along the second direction are expanded by etching the barrier layer 30 and the spacer portions 50. The third grooves 103 are formed at the positions of the first grooves 101, and the widths of the third grooves 103 along the second direction are effectively increased through two times of widening, such that the widths of the conductive connection portions 60 along the second direction Y are increased, the resistance of the conductive connection portions 60 is reduced, and the signal transmission efficiency of the conductive connection portions 60 is improved.

In the fabrication method of the memory device of the present disclosure, the mask portions 43 are formed to reserve and control the heights of the conductive connection portions 60 to be formed. Then, when the mask portions 43 are removed to form the third grooves 103, the conductive connection portions 60 may be formed within the third grooves 103, i.e., the heights of the conductive connection portions 60 may be controlled by the depths of the third grooves 103, and may be further controlled by the heights of the mask portions 43, such that the memory device provided by implementations of the present disclosure can achieve the controllable heights of the conductive connection portions 60 to meet different design requirements, thereby improving the applicability of the memory device.

Additionally, in conjunction with FIG. 19, some implementations of the present disclosure further provide a memory device, which is fabricated by using the fabrication method of the memory device as described in the above-mentioned implementations. The memory device includes a plurality of semiconductor bodies 10, spacing portions 20, conductive connection portions 60, and spacer portions 50.

The plurality of semiconductor bodies 10 are disposed as being spaced apart, and the spacing portions 20 are disposed between adjacent semiconductor bodies 10 that extend along a first direction (X direction); the conductive connection portions 60 are connected to the semiconductor bodies 10 along the first direction; and the spacer portions 50 are disposed on sides of the spacing portions 20 along the first direction and disposed around the conductive connection portions 60.

Further, the conductive connection portions 60 and the spacing portions 20 partially overlap along a second direction (Y direction) that is perpendicular to the first direction.

Figure 20:
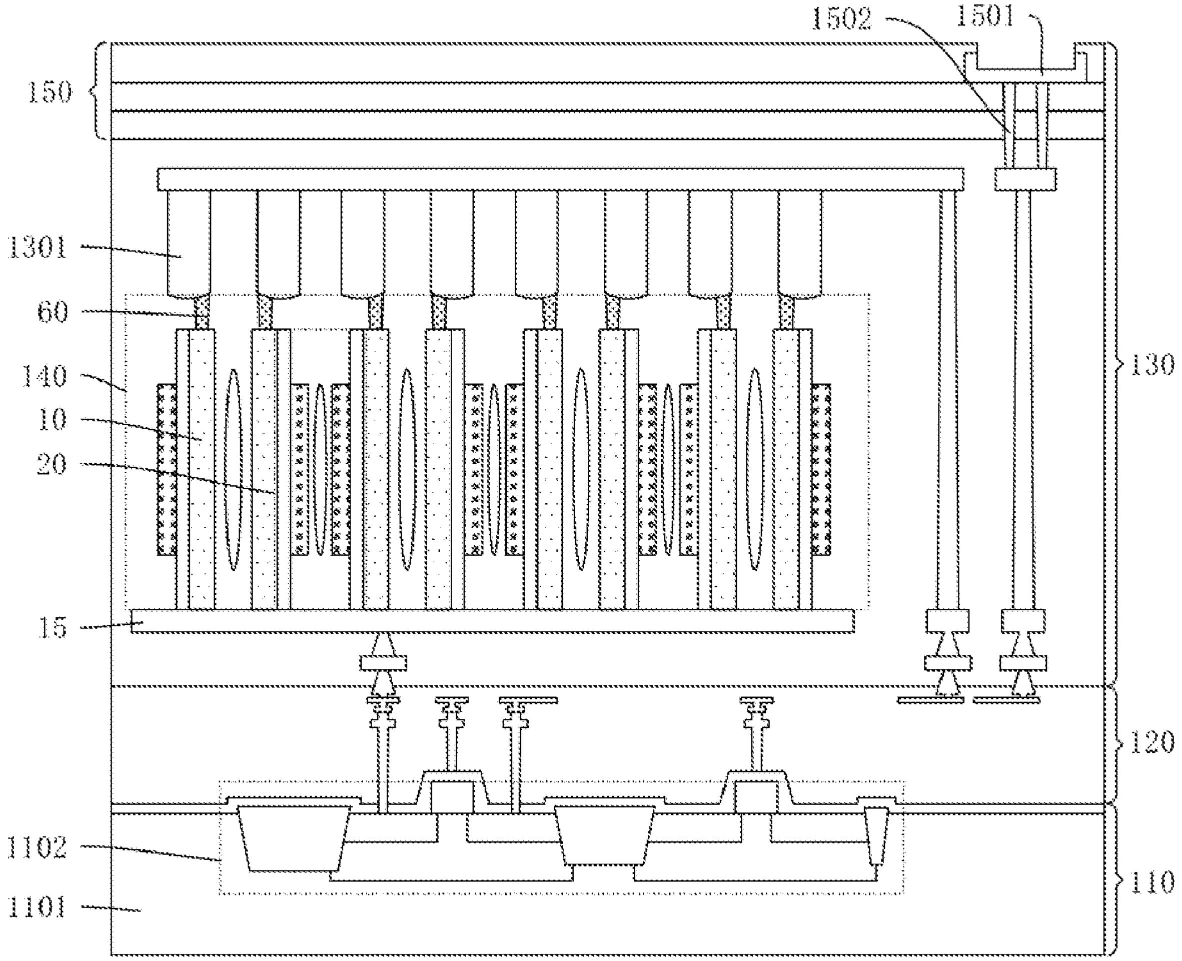
FIG. 20 is a schematic structure diagram of a memory device provided by some implementations of the present disclosure.

In conjunction with FIGS. 19, 20, and 21, in some implementations, the memory device may include a first semiconductor structure 110 and a second semiconductor structure 130 formed by stacking. The first semiconductor structure 110 and the second semiconductor structure 130 are connected together by bonding through the interconnection layer 120.

The first semiconductor structure 110 includes a substrate 1101 and a peripheral circuit 1102 disposed on the substrate 1101. In some implementations, the peripheral circuit 1102 includes a plurality of transistors (e.g., planar transistors and/or 3D transistors). Trench isolations (e.g., shallow trench isolations (STIs)) and doped regions may be formed on or in the substrate 1101.

In some implementations, the material of the substrate 1101 may include, but not be limited to, silicon (e.g., monocrystalline silicon, c-Si), silicon germanium (SiGe), gallium arsenide (GaAs), germanium (Ge), silicon on insulator (SOI), or any other suitable materials.

The second semiconductor structure 130 includes a transistor device layer 140, a bit line 15 connected with the transistor device layer 140, and capacitors 1301 connected with the transistor device layer 140. The transistor device layer 140 is connected between the bit line 15 and the capacitors 1301, while the bit line 15 is connected with the peripheral circuit 1102 in the first semiconductor structure 110 through an interconnection layer 120 to achieve transmission of an electrical signal.

In some implementations, a pad outer interconnection layer 150 is further disposed on a side of the second semiconductor structure 130 far away from the first semiconductor structure 110, and may include a contact pad 1501 and contacts 1502 connected to the contact pad 1501. The contacts 1502 may be connected into the interconnection layer 120 and the first semiconductor structure 110, so that the coupling of the memory device with the external peripheral circuit may be achieved.

In some implementations of the present disclosure, the structure as shown in FIG. 19 is a film layer structure in the corresponding transistor device layer 140 in FIG. 20, while the structure as shown in FIG. 21 is a film layer structure corresponding to the spacing portion 20 in FIG. 19.

In the transistor device layer 140, the semiconductor bodies 10 include drains 11, channels 12, and sources 13 arranged along the first direction X. The channels 12 are located between the drains 11 and the sources 13, the drains 11 are connected to the bit line 15, and the sources 13 are located on sides of the channels 12 close to the conductive connection portions 60. That is, the conductive connection portions 60 are connected with the sources 13 along the first direction X, while the sources 13 are connected with the capacitors 1301 through the conductive connection portions 60.

The spacing portions 20 include first spacing portions 201 and second spacing portions 202 that are alternately disposed. The first spacing portions 201 include gates 21 close to sides of the channels 12 and gate insulation portions 22 located between the gates 21 and the channels 12. In some implementations, the first spacing portions 201 may further include dielectric sub-portions 23 cladding the gates 21 and the gate insulation sub-portions 22, while the second spacing portions 202 only include dielectric sub-portions 23 to play the role of insulation and spacing between adjacent semiconductor bodies 10.

In some implementations of the present disclosure, the widths of ends of the conductive connection portions 60 far away from the semiconductor bodies 10 along the second direction are greater than the widths of ends of the conductive connection portions 60 close to the semiconductor bodies 10 along the second direction. The ends of the conductive connection portions 60 close to the semiconductor bodies 10 and the spacing portions 20 overlap along the second direction, and the ends of the conductive connection portions 60 far away from the semiconductor bodies 10 and the spacer portions 50 overlap along the second direction. The widths of the conductive connection portions 60 along the second direction are greater than the widths of the semiconductor bodies 10 along the second direction. In some implementations, the widths of the conductive connection portions 60 along the second direction on the sides close to the semiconductor bodies 10 are greater than the maximum width of the semiconductor bodies 10 along the second direction.

In some implementations of the present disclosure, the minimum width of the conductive connection portions 60 along the second direction is greater than the widths of the semiconductor bodies 10 along the second direction, which can effectively reduce the resistance of the conductive connection portions 60 and improve the signal transmission efficiency of the conductive connection portions 60.

The top faces of sides of the conductive connection portions 60 far away from the sources 13 are flush with the top faces of sides of the spacer portions 50 far away from the semiconductor bodies 10 so as to provide a good topographic basis for subsequent film layer deposition, which can increase a yield of the memory device.

In some implementations, the memory device further includes a barrier layer 30 that is disposed between the spacer portions 50 and the spacing portions 20.

Figure 22:
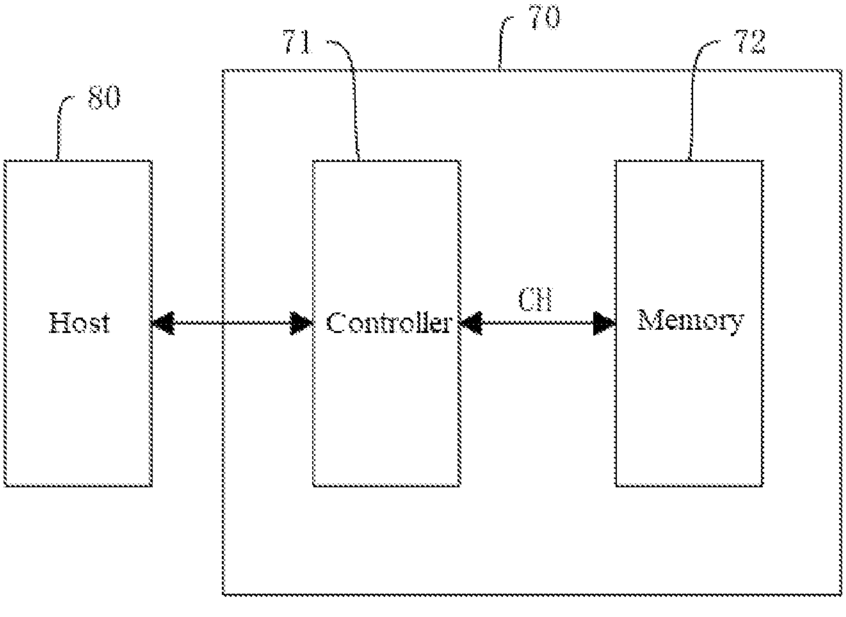
FIG. 22 is a schematic structure diagram of a memory system provided by some implementations of the present disclosure.

In addition, some implementations of the present disclosure further provide a memory system. Referring to FIG. 22, the memory system 70 includes a memory device 72 and a controller 71. The controller 71 is coupled to the memory device 72 and configured to control the memory device 72 to store data, and the memory device 72 is the memory device fabricated by the fabrication method of the memory device as described in the above-mentioned implementations or the memory device as described in the above-mentioned implementations.

The memory system may be applied to a mobile phone, a desktop computer, a laptop computer, a tablet computer, a vehicle computer, a game console, a printer, a positioning apparatus, a wearable electronic apparatus, a smart sensor, a virtual reality (VR) apparatus, an augmented reality (AR) apparatus, or any other suitable electronic apparatuses having memory devices therein. As shown in FIG. 22, a host 80 may be a processor of an electronic apparatus, such as a central processing unit (CPU), or a system on chip (SoC), such as an application processor (AP). The host 80 may be configured to send or receive data to or from the memory device 72. In order to send or receive the data to or from the memory device 72, the host 80 may also send an instruction to the memory system 70 in addition to the data.

In some implementations, the controller 71 is coupled to the memory device 72 and the host 80, and is configured to control the memory device 72. The controller 71 can manage the data stored in the memory device 72 and communicate with the host 80.

In some implementations, the controller 71 is designed for operating in a low duty-cycle environment such as Secure Digital (SD) cards, Compact Flash (CF) cards, Universal Serial Bus (USB) flash drives, or other media for use in electronic apparatuses, such as personal computers, digital cameras, mobile phones, etc.

In some implementations, the controller 71 is designed for operating in high duty-cycle environment SSDs or embedded multi-media-cards (eMMCs) used as data memories for mobile apparatuses, such as smartphones, tablets, laptop computers, etc., and enterprise memory arrays. The controller 71 may be configured to control operations of the memory device 72, such as reading, erasing, and programming operations. For example, based on instructions received from the host 80, the controller 71 can transmit various commands such as a programming command, a reading command, an erasing command, or the like to the memory device 72 to control operations of the memory device 72.

The controller 71 may be further configured to manage various functions with respect to data stored or to be stored in the memory device 72, including, but not limited to, bad-block management, garbage collection, logical-to-physical address conversion, wear leveling, etc. In some implementations, the controller 71 is further configured to process error correction codes (ECCs) with respect to the data read from or written to the memory device 72. The controller 71 may also perform any other suitable functions, for example, formatting the memory device 72. The controller 71 may communicate with an external apparatus (e.g., the host 80) according to a particular communication protocol. For example, the controller 71 may communicate with the external apparatus through at least one of various interface protocols, such as a USB protocol, a MMC protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, a Firewire protocol, etc.

Figure 23:
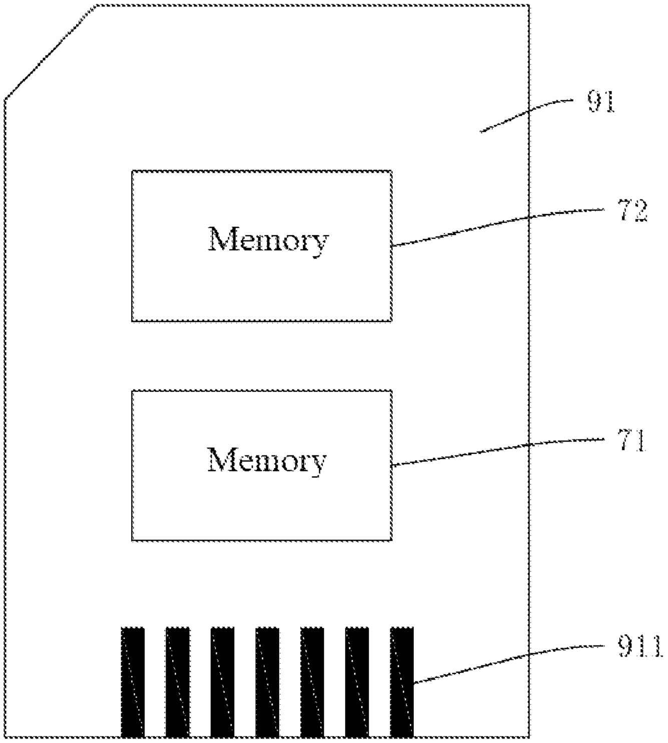
FIG. 23 is a schematic structure diagram of a memory device card having a memory system provided by some implementations of the present disclosure.

In some implementations, referring to FIG. 23, the above-mentioned memory system may be applied into a memory card 91. For example, the controller 71 and a single memory device 72 may be integrated into the memory card 91. The memory card 91 may include a PC card (PCMCIA, Personal Computer Memory Card International Association), a CF card, a Smart Media (SM) card, a memory stick, a multimedia card (MMC, RS-MMC, MMCmicro), an SD card (SD, miniSD, microSD, SDHC), a UFS, etc. The memory card 91 may further include a memory card connector 911 coupling the memory card 91 to a host (e.g., the host 80 in FIG. 22).

Figure 24:
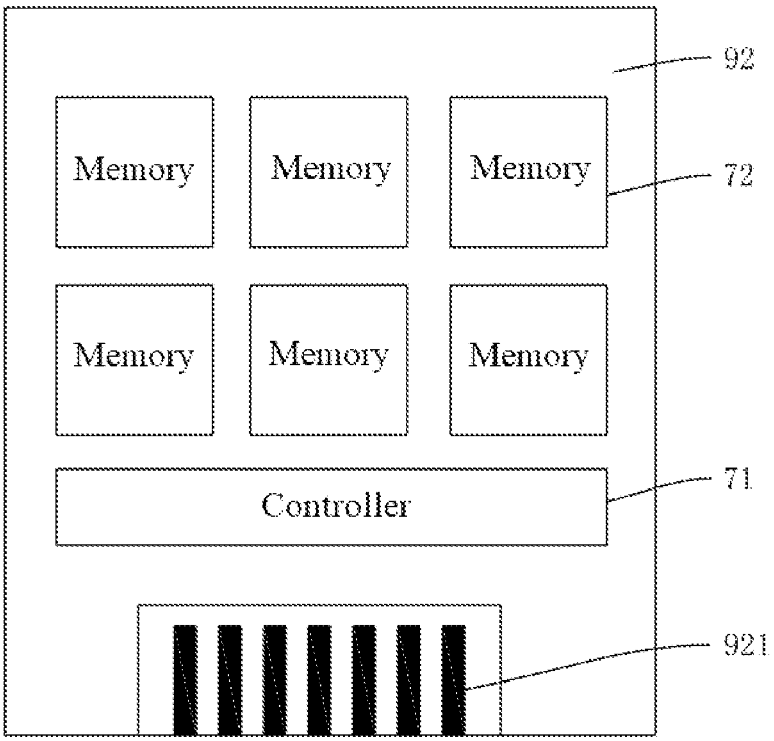
FIG. 24 is a schematic structure diagram of a solid-state drive having a memory system provided by some implementations of the present disclosure.

In some implementations, referring to FIG. 24, the above-mentioned memory system may be applied into a solid-state drive (SSD) 92, for example, the controller 71 and multiple memories 72 may be integrated into the solid-state drive 92. The solid-state drive 92 may further include a solid-state drive connector 921 coupling the solid-state drive 92 with a host (e.g., the host 80 in FIG. 22).

In some implementations, the storage capacity and/or the operation speed of the solid-state drive 92 as shown in FIG. 24 are greater than the storage capacity and/or the operation speed of the memory card 91 as shown in FIG. 23.

Further, some implementations of the present disclosure also provide an electronic apparatus that includes the above-mentioned memory system provided in some implementations of the present disclosure. The electronic apparatus may be any apparatus that may store data, such as a mobile phone, a desktop computer, a tablet, a notebook computer, a server, a vehicle apparatus, a wearable apparatus, a mobile power supply, etc.

A memory device and a fabrication method thereof and a memory system provided by implementations of the present disclosure are introduced in detail above. The principle and implementations of the present disclosure are set forth herein by applying individual examples. The descriptions of the implementations above are only used to help understand technical solutions and core ideas of the present disclosure. Those of ordinary skill in the art should understand that they may still modify the technical solutions as set forth in various aforementioned implementations, or equivalently substitute part of the technical features. However, these modifications or substitutions do not make the essence of the respective technical solutions depart from the scope of the technical solutions of various implementations of the present disclosure.

What is claimed is:

1. A memory device, comprising:

a plurality of semiconductor bodies spaced apart from each other and extending along a first direction;

spacing portions between adjacent semiconductor bodies;

conductive connection portions connected to the semiconductor bodies along the first direction; and spacer portions disposed on sides of the spacing portions along the first direction and disposed around the conductive connection portions, wherein:

widths of first ends of the spacing portions closer to the spacer portions, measured along a second direction perpendicular to the first direction, are smaller than widths of second ends of the spacing portions away from the spacer portions, and the conductive connection portions and the spacing portions overlap along the second direction; and the spacing portions comprise gates arranged between the first ends of the spacing portions and the second ends of the spacing portions.

2. The memory device of claim 1, wherein the semiconductor bodies comprise drains, channels, and sources that are arranged along the first direction, and the sources are located on sides of the channels close to the conductive connection portions that are connected to the sources along the first direction.

3. The memory device of claim 2, wherein portions of the spacing portions comprise the gates close to sides of the channels and gate insulation sub-portions between the gates and the channels.

4. The memory device of claim 1, wherein ends of the conductive connection portions close to the semiconductor bodies and the spacing portions overlap along the second direction, and ends of the conductive connection portions far away from the semiconductor bodies and the spacer portions overlap along the second direction.

5. The memory device of claim 1, wherein widths of ends of the conductive connection portions far away from the semiconductor bodies along the second direction are greater than widths of ends of the conductive connection portions close to the semiconductor bodies along the second direction.

6. The memory device of claim 1, wherein widths of the conductive connection portions along the second direction are greater than widths of the semiconductor bodies along the second direction.

7. The memory device of claim 1, wherein the memory device further comprises a barrier layer disposed between a spacer portion of the spacer portions and a spacing portion of the spacing portions.

8. The memory device of claim 1, wherein:

widths of the spacer portions along the second direction are smaller than the widths of the first ends of the spacing portions closer to the spacer portions.

9. The memory device of claim 1, further comprising:

a barrier layer disposed between a spacer portion of the spacer portions and a spacing portion of the spacing portions, a width of the barrier layer along the second direction being smaller than a width of the spacing portion.

10. The memory device of claim 1, wherein:

a conductive connection portion of the conductive connection portions has a width along the second direction that narrows toward a first side along the first direction to fit into a complementary recess of a spacing portion of the spacing portions, the complementary recess of the spacing portion being defined by a width of the spacing portion that narrows toward a second side along the first direction opposite the first side.

11. The memory device of claim 1, wherein:

the spacing portions comprise dielectric sub-portions covering ends of the gates and ends of gate insulation sub-portions in the spacing portions.

12. The memory device of claim 1, wherein:

the spacing portions comprise dielectric sub-portions and gate insulation sub-portions arranged between the first ends of the spacing portions and the second ends of the spacing portions; and the gates and the gate insulation sub-portions are embedded in the dielectric sub-portions.

13. The memory device of claim 1, wherein:

each of the semiconductor bodies comprises a drain, a channel, and a source that are arranged along the first direction; and the drains of the semiconductor bodies are connected to a bit line.

14. A memory system, comprising:

a memory device; and a controller coupled to the memory device and configured to control the memory device to store data, wherein the memory device comprises:

a plurality of semiconductor bodies spaced apart from each other and extending along a first direction;

spacing portions between adjacent semiconductor bodies;

conductive connection portions connected to the semiconductor bodies along the first direction; and spacer portions disposed on sides of the spacing portions along the first direction and disposed around the conductive connection portions, wherein:

widths of first ends of the spacing portions closer to the spacer portions, measured along a second direction perpendicular to the first direction, are smaller than widths of second ends of the spacing portions away from the spacer portions, and the conductive connection portions and the spacing portions overlap along the second direction; and the spacing portions comprise gates arranged between the first ends of the spacing portions and the second ends of the spacing portions.

15. The memory system of claim 14, wherein in the memory device:

widths of the spacer portions along the second direction are smaller than the widths of the first ends of the spacing portions closer to the spacer portions.

16. The memory system of claim 14, wherein the memory device further comprises:

a barrier layer disposed between a spacer portion of the spacer portions and a spacing portion of the spacing portions, a width of the barrier layer along the second direction being smaller than a width of the spacing portion.

17. The memory system of claim 14, wherein:

in the memory device, the spacing portions comprise dielectric sub-portions covering ends of the gates and ends of gate insulation sub-portions in the spacing portions.

18. The memory system of claim 14, wherein in the memory device:

the spacing portions comprise dielectric sub-portions and gate insulation sub-portions arranged between the first ends of the spacing portions and the second ends of the spacing portions; and the gates and the gate insulation sub-portions are embedded in the dielectric sub-portions.

19. The memory system of claim 14, wherein in the memory device:

each of the semiconductor bodies comprises a drain, a channel, and a source that are arranged along the first direction; and the drains of the semiconductor bodies are connected to a bit line.

20. The memory system of claim 14, wherein in the memory device:

a conductive connection portion of the conductive connection portions has a width along the second direction that narrows toward a first side along the first direction to fit into a complementary recess of a spacing portion of the spacing portions, the complementary recess of the spacing portion being defined by a width of the spacing portion that narrows toward a second side along the first direction opposite the first side.

* * * * *